United States Patent [19]

De Long

[11] Patent Number: 5,109,256

[45] Date of Patent: Apr. 28, 1992

[54] SCHOTTKY BARRIER DIODES AND SCHOTTKY BARRIER DIODE-CLAMPED TRANSISTORS AND METHOD OF FABRICATION

[75] Inventor: Bancherd De Long, Puyallup, Wash.

[73] Assignee: National Semiconductor Corporation, Santa Clara, Calif.

[21] Appl. No.: 569,789

[22] Filed: Aug. 17, 1990

[51] Int. Cl.$^5$ .................. H01L 29/48; H01L 29/56; H01L 29/72

[52] U.S. Cl. ........................................ 357/15; 357/34; 357/58; 357/59

[58] Field of Search ................... 357/15, 34, 59, 58

[56] References Cited

U.S. PATENT DOCUMENTS

| | | |
|---|---|---|
| 3,790,817 | 2/1974 | Dobkin . |
| 3,955,269 | 5/1976 | Magdo et al. . |
| 4,220,961 | 9/1980 | Werner .................. 357/59 |
| 4,484,388 | 11/1984 | Iwasaki . |
| 4,507,847 | 4/1985 | Sullivan . |
| 4,536,945 | 8/1985 | Gray et al. . |
| 4,543,595 | 9/1985 | Vora .................. 357/15 |
| 4,609,568 | 9/1986 | Koh et al. . |
| 4,628,339 | 12/1986 | Vora et al. .................. 357/15 |
| 4,732,873 | 3/1988 | Perbet .................. 357/58 |
| 4,764,480 | 8/1988 | Vora . |
| 4,795,722 | 1/1989 | Welch et al. . |
| 4,829,025 | 5/1989 | Iranmanesh . |
| 4,897,364 | 1/1990 | Nguyen . |

OTHER PUBLICATIONS

Brassington, et al., "An Advanced Single-Level Polysilicon Submicrometer BiCMOS Technology," IEEE Trans. Elect. Devices.

Momose, et al., "1μm n-well CMOS/Bipolar Technology", IEDM Transactions (Feb. 1985) p. 217.

Kapoor, et al., "A High Speed High Density Single-Poly ECL Technology for Linear/Digital Applications" 1985 Custom Integrated Circuits Conference.

Gomi, et al., "A Sub-30psec Si Bipolar LSI Technology" IEDM Technical Digest (1988) pp. 744–747.

Takemura, et al., "BSA Technology for Sub-100mn Deep Base Bipolar Transistors" IEDM Technical Digest (1987), pp. 375–377.

Chiu, et al., "A Bird's Beak Free Local Oxidation Technology Feasible to VSLI Circuits Fabrication" IEEE Transactions on Electron Devices, vol. ED-29, No. 4, pp. 536–540, Apr. 1982.

Primary Examiner—Jerome Jackson, Jr.
Attorney, Agent, or Firm—Irving Rappaport; Robert C. Colwell; Richard L. Hughes

[57] ABSTRACT

A Schottky diode is formed with a layer of intrinsic polysilicon separating a metal silicide layer from an n conductivity type active region. This structure avoids the necessity for a process step which opens a window in the intrinsic polysilicon layer and reduces the portion of surface area needed for formation of a Schottky diode, compared to previous devices. The Schottky diode can be formed as part of an overall process for forming an integrated circuit and can be positioned in parallel across the collector/base junction of a bipolar transistor to form a Schottky barrier diode-clamped transistor.

8 Claims, 8 Drawing Sheets

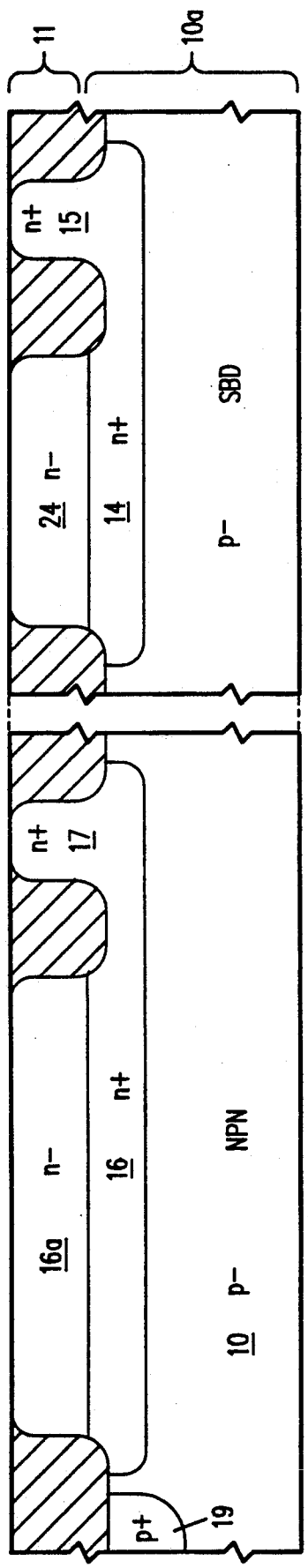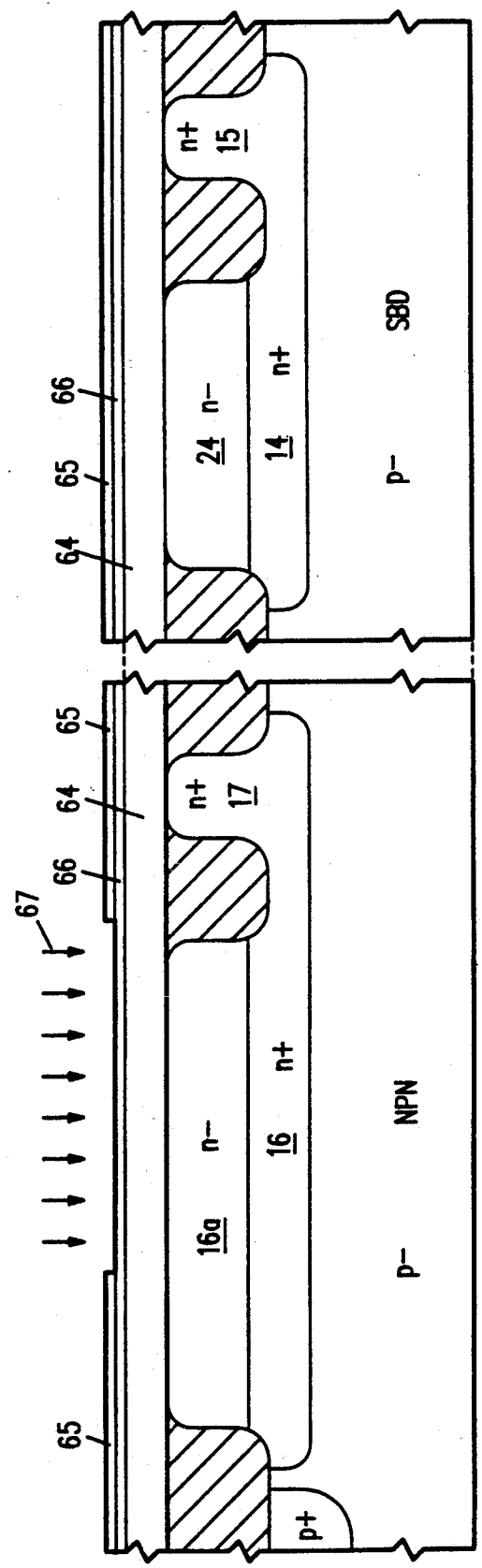
FIG. 2A
FIG. 2B

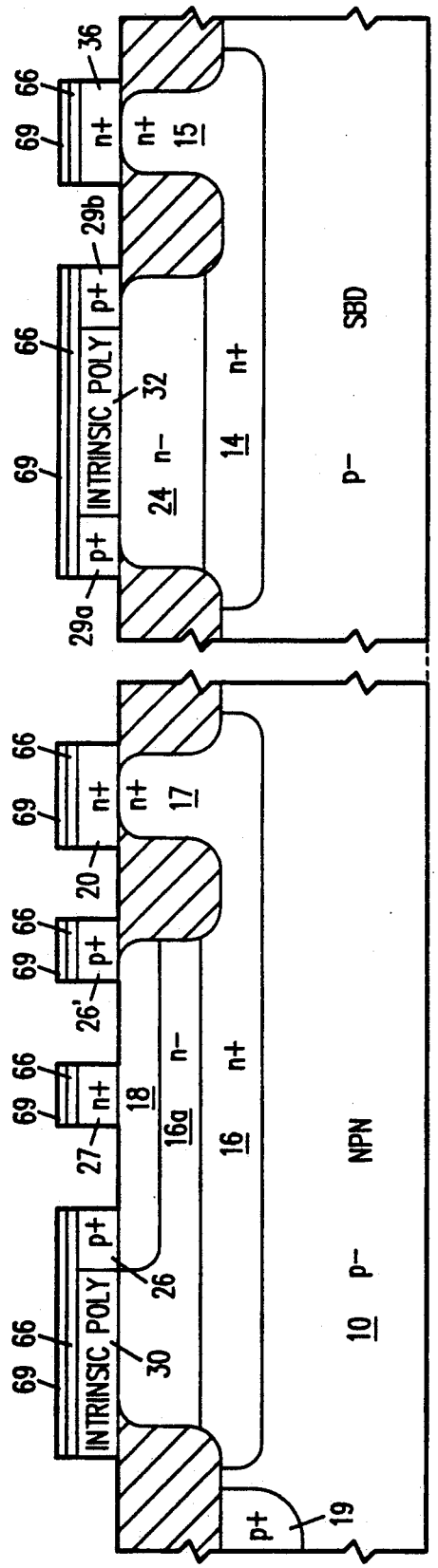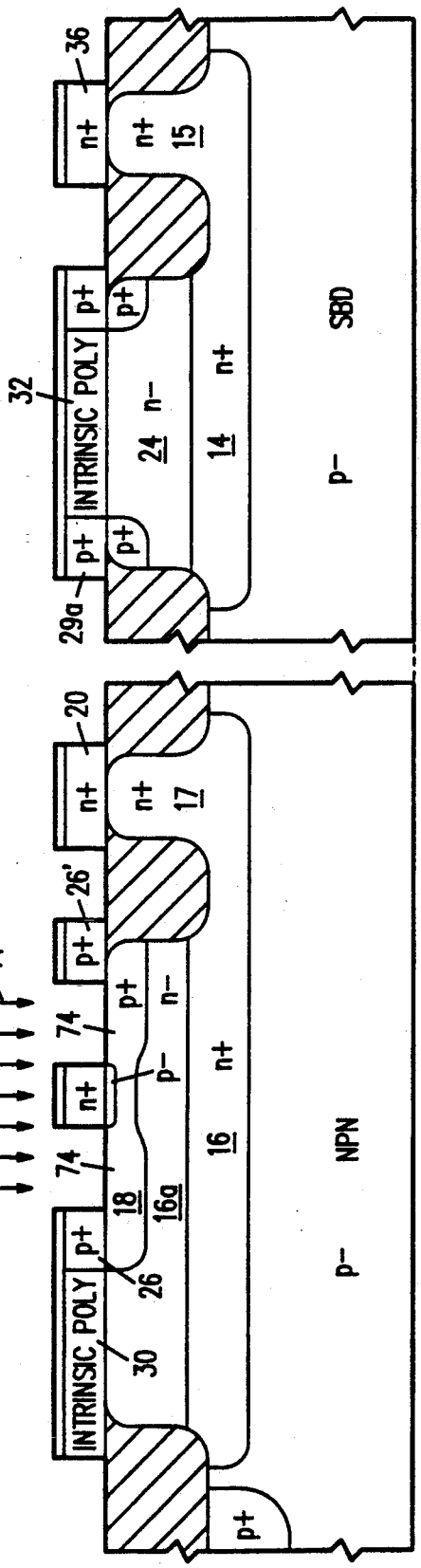
FIG. 2E
FIG. 2F

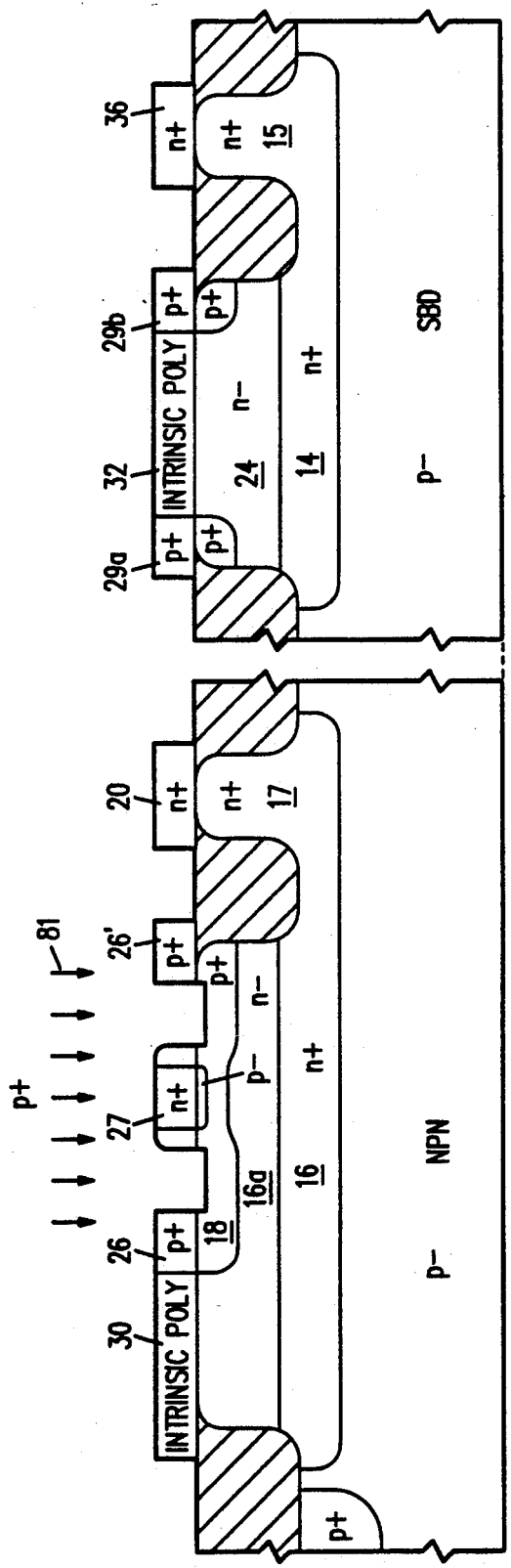
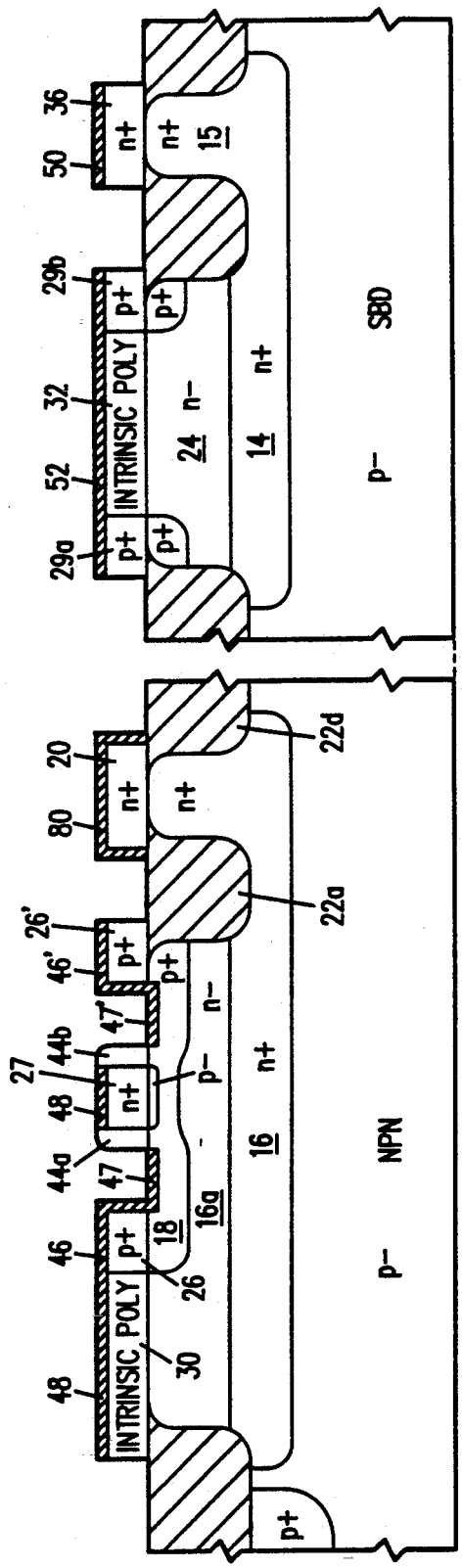
FIG. 2I
FIG. 2J

SCHOTTKY BARRIER DIODES AND SCHOTTKY BARRIER DIODE-CLAMPED TRANSISTORS AND METHOD OF FABRICATION

BACKGROUND OF THE INVENTION

The present invention relates to the field of semiconductor devices and their manufacture. More specifically, in one embodiment the invention provides a Schottky barrier diode formed using a single polysilicon layer process.

Schottky barrier diodes (SBD) or "Schottky diodes" are known particularly for their low voltage drop and rapid switching ability. Schottky barrier diodes are often used for clamping bipolar transistors to form a Schottky-clamped transistor, as described, generally, in U.S. Pat. No. 3,790,817 issued 2/5/74 to Dobkin. Methods of making Schottky diodes using a polysilicon/metal-silicide process have, in the past, involved doping the polysilicon and contacting metal directly with N-doped polysilicon as described in U.S. Pat. No. 4,908,679 issued 3/13/90 to Vora, et al., or opening a window in a polysilicon layer to permit contact of metal or metal silicide directly with an N- conductivity type epitaxial layer. Such previous methods have required the inclusion of multiple processing steps used in the formation of such diodes. For example, in order to open a window in a polysilicon layer, a mask is formed and an etching step must be conducted. Furthermore, because each window requires an edge or overlap area, in addition to the window area, previous methods for forming Schottky diodes occupied a relatively large surface area of an integrated circuit.

It has also been found that in previous Schottky diodes formed using a polysilicon process, the Schottky diode junction was often found to be shallow or degraded in certain regions causing localized areas of enhanced diffusion resulting in junction spiking.

Accordingly, there is a need for providing a Schottky diode which occupies a relatively smaller portion of an integrated circuit surface area, which requires fewer process steps, which is less susceptible to junction spiking, and which is more manufacturable compared to previous Schottky diode devices formed in integrated circuits using a polysilicon process.

SUMMARY OF THE INVENTION

An improved Schottky diode device and single polysilicon method of fabrication is disclosed. The invention includes a recognition of the shortcomings of previous Schottky diodes and provides Schottky diodes which can be formed using a relatively smaller portion of an integrated circuit surface area, which are less susceptible to junction spiking and which may be fabricated with fewer process steps than previous single polysilicon process Schottky barrier diodes. The Schottky diodes may be formed during the fabrication of bipolar or BiCMOS integrated circuits which may be used, for example, with high performance emitter coupled logic (ECL), standard cell designs, memory cells, gate array designs with embedded memory, and the like. The Schottky diodes can be effectively connected in parallel with the collector and base of bipolar transistors, forming Schottky-clamped transistors.

In one embodiment, the invention involves forming an active region in a substrate, forming a layer of intrinsic polysilicon adjacent the upper surface of the active region, and forming a layer of metal silicide adjacent the upper surface of the intrinsic polysilicon. The metal silicide forms the anode of a Schottky diode.

In one preferred embodiment, the Schottky diode is formed as a part of an overall process for forming an integrated circuit. In the overall process, an active region is formed in a substrate, followed by epitaxial silicon growth, oxide isolation, and polysilicon deposition. The polysilicon is implanted and patterned to form bipolar and, optionally, MOS transistors, well taps, substrate taps and local interconnect. At least a portion of the polysilicon adjacent an active region of the epitaxial layer is maintained as intrinsic polysilicon. Oxide spacers are formed and selectively removed from base contacts, after which a refractory or noble metal coating is deposited on the tops and sidewalls of all structures. The metal is reacted with the underlying polysilicon and epitaxial silicon forming a low resistance silicide layer everywhere but on the isolation field oxide and spacers. In one preferred embodiment, the metal silicide which forms the anode of a Schottky diode extends to an upper surface of the polysilicon base contact. The active layer which forms the cathode of Schottky diode also acts as the collector of the bipolar transistor, thus effectively connecting the Schottky diode in parallel with the base and collector of the bipolar transistor.

Because the intrinsic polysilicon positioned between the metal silicide and the active layer is not removed, the Schottky diode formed according to the present invention requires fewer process steps and occupies less surface area than previous Schottky diodes. The presence of the intrinsic polysilicon prevents degradation of the Schottky diode junction and reduces or eliminates the incidence of junction spiking.

A further understanding of the nature and advantages of the invention herein may be realized by reference to the remaining portions of the specification and the attached drawings.

BRIEF DESCRIPTION OF THE DRAWINGS

FIG. 2A to 2K illustrate fabrication of an integrated circuit of the type shown in FIG. 1.

DESCRIPTION OF THE PREFERRED EMBODIMENT

CONTENTS
I. General
II. Fabrication Sequence of a BiCMOS Device
III. Device Performance

I. General

Figure 1:
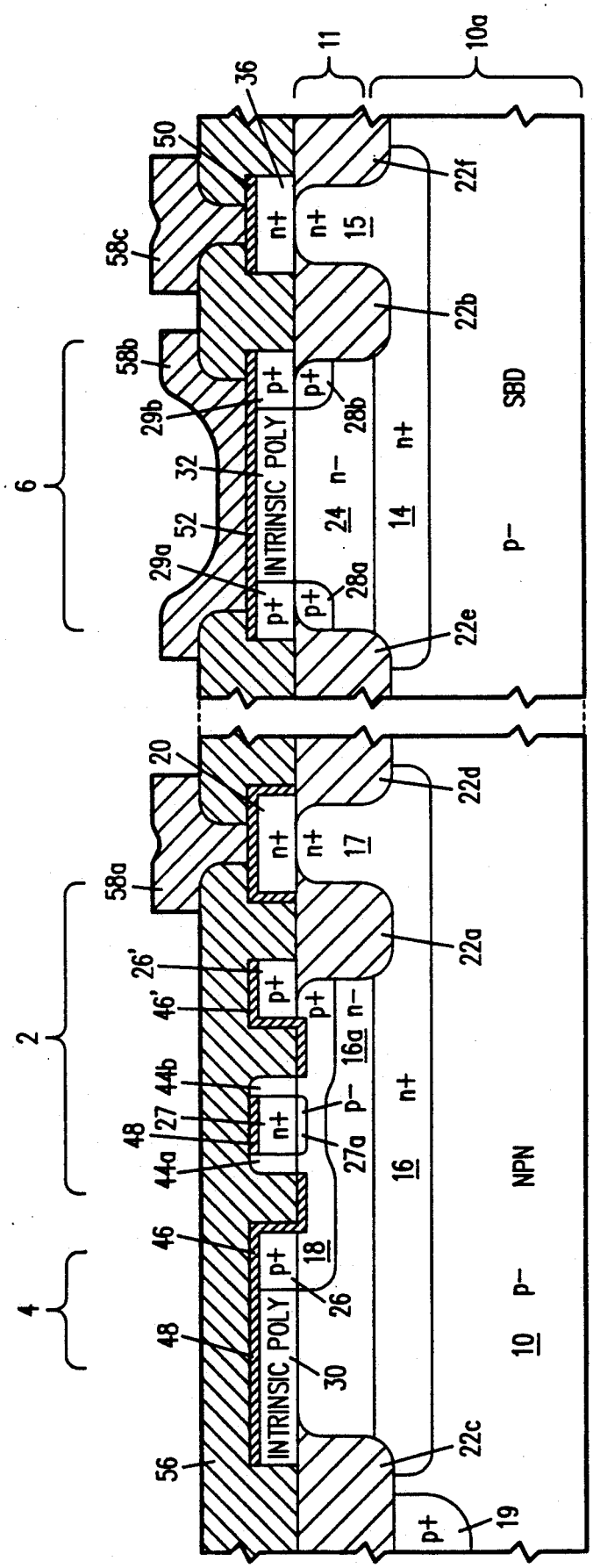
FIG. 1 is a cross-section of portions of an integrated circuit showing a Schottky barrier diode (SBD) and a Schottky barrier diode-clamped NPN bipolar transistor.

FIG. 1 illustrates a portion of an integrated circuit in cross-section according to one embodiment of the invention. The device includes a bipolar transistor 2 (which in the embodiment shown in FIG. 1 is an NPN transistor) formed with a Schottky diode 4, and a Schottky barrier diode 6. The devices are fabricated on a substrate 10 which preferably includes a single-crystal body 10a and an epitaxial layer 11. In the embodiment shown in FIG. 1 the substrate 10 is a p- substrate having a dopant concentration of between about $1\times 10^{13}$ and $1\times 10^{15}$ atoms per cubic centimeter.

The NPN transistor 2 is provided with a heavily doped buried layer 16 and collector sink 17, which together provide a low resistance connection region between a collector contact 20 and the collector 16a beneath p-type base 18. In preferred embodiments the buried layer 16 and sink 17 are doped to a concentration of between about $1\times 10^{18}$ and $1\times 10^{20}$. The collector 16a is a more lightly doped n-type formed between the base region 18 and the buried layer 16. An emitter region 27a is diffused from the emitter contact 27 into the underlying epitaxial layer 11. It is to be understood that those of skill in the art sometimes refer to the emitter contact 27 as the emitter. No difference in meaning is intended herein.

The Schottky barrier diode 6 is provided with a heavily doped active region 14 and a SBD sink 15 which together provide a low resistance connection region between the SBD cathode 24 and SBD cathode contact 36. In the preferred embodiments, the active region 14 and cathode sink 15 are doped similarly to the buried layer and collector sink 16, 17 of the NPN transistor 2. The cathode 24 is an N-type conductivity region which is more lightly-doped than the buried layer 14 and sink 15. A guard ring 28a, 28b is provided to reduce or eliminate the effect of trapped charges on conduction of the device which can result from oxides positioned along the edge of the cathode portion of the Schottky diode. The guard ring 28a, 28b is diffused from doped polysilicon regions 29a, 29b into the underlying epitaxial region 11.

P+ channel stop 19 is provided between the NPN transistor and adjacent devices to prevent surface inversion of the lightly doped substrate. Between the transistor sink 17 and the base 18, between the SBD sink 15 and the SBD cathode 24, between the NPN transistor 2 and adjacent structures, and between the Schottky diode 6 and adjacent structures, oxide isolation regions 22a, 22b, 22c, 22d, 22e, and 22f, respectively, are provided for device isolation. Viewed from the top of the structure, these oxide isolation regions connect to each other to form annular bands around the active device areas.

Along the surface of the device are polycrystalline silicon (polysilicon) regions forming p+ base contacts 26 and 26', emitter contact 27, n+ collector contact 20, SBD cathode contact 36, diffusion source regions 29a, 29b, and intrinsic polysilicon regions 30, 32.

Refractory metal silicide contacts 46, 46' are formed on the p+ bipolar transistor base contacts 26, 26'. The silicide contact covers the upper portions of the base contacts, the sidewalls of the base contacts, as well as the base region from the sidewalls of the base contacts up to the sidewall oxide 44a, 44b of the emitter contact 27. The silicide contact 46 for one of the base contacts 26 extends over the top surface of the intrinsic polysilicon 30. A separate silicide contact 48 is provided along the top portion of the emitter 27 between the sidewall spacer oxide regions 44a, 44b. The refractory metal contacts shown herein reduce the resistivity of the base contact and, therefore, increase the speed of the device. A portion of silicide 47 extending over the intrinsic polysilicon region 30 acts as the anode of a Schottky barrier diode.

A silicide contact 50 is provided on the upper surface of the SBD cathode contact 36. A layer of silicide 52 is provided on the upper surface of the intrinsic polysilicon 32 and diffusion source regions 29a, 29b of the SBD. The metal silicide layer 52 acts as the anode of the Schottky barrier diode 6.

The structure further includes a thick (0.7 to 1.5 micron) oxide layer 56 to insulate underlying structures from the metal layer 58a, 58b, 58c used for interconnection purposes. Metal interconnection is also preferably provided for the emitter contact 27 and at least one of the base contacts 26, 26' of the transistor 2, in a plane not shown in FIG. 1.

II. Fabrication Sequence of a BiCMOS Device

FIGS. 2A through 2N illustrate fabrication of the integrated circuit shown in FIG. 1. In particular, FIG. 2A illustrates a cross-section at a first stage of fabrication. To reach this stage, the single-crystal body 10a was masked for simultaneous formation of the buried layers 16, 14 with arsenic, antimony, or the like. The implant energy used for formation of regions 14 and 16 is preferably between about 50 and 100 keV such that the dopant concentration of regions 14 and 16 is between about $1\times 10^{18}$ and $1\times 10^{20}$.

After formation of the n+ regions 14 and 16, the device is then masked for formation of the p+ channel stop 19. The implant energy used in formation of the region 19 is preferably between about 100 and 180 keV such that the dopant concentration of the p+ buried layers is between about $1\times 10^{17}$ and $1\times 10^{18}$. The p+ region preferably is doped with boron.

The channel stop mask is then removed and an intrinsic n-type epitaxial layer 11 having a thickness of about 1 to 1.2 microns, preferably about 1.1 microns is grown across the surface of the single-crystal body 10a. A photoresist mask (not shown) is then formed over the device so as to define oxide regions 22a, 22b, 22c, 22d, 22e, and 22f. The oxide regions are formed using a modified sidewall masked isolation ("SWAMI") process. The SWAMI process is described in, e.g., Chin, et al., IEEE Transactions on Electron Devices, Vol. ED-29, No. 4, Apr. 1982, pp. 536-540. In some embodiments, the process is modified as described in co-pending application Ser. No. 502,943 (Attorney Docket No. 8332-237), incorporated by reference.

Thereafter, a grown screen oxide layer having a thickness of about 250Å is formed on the surface of the device and a mask is formed, exposing only the sink regions 15, 17. A sink implant using an implant energy of between about 100 and 180 keV is preferred using phosphorous as a dopant. The resulting dopant concentration in the sink regions 15, 17 is between about $1\times 10^{18}$ and $1\times 10^{20}$. The sink and n-well are then annealed and driven-in by heating with a conventional thermal cycle in nitrogen.

Figure 2C:
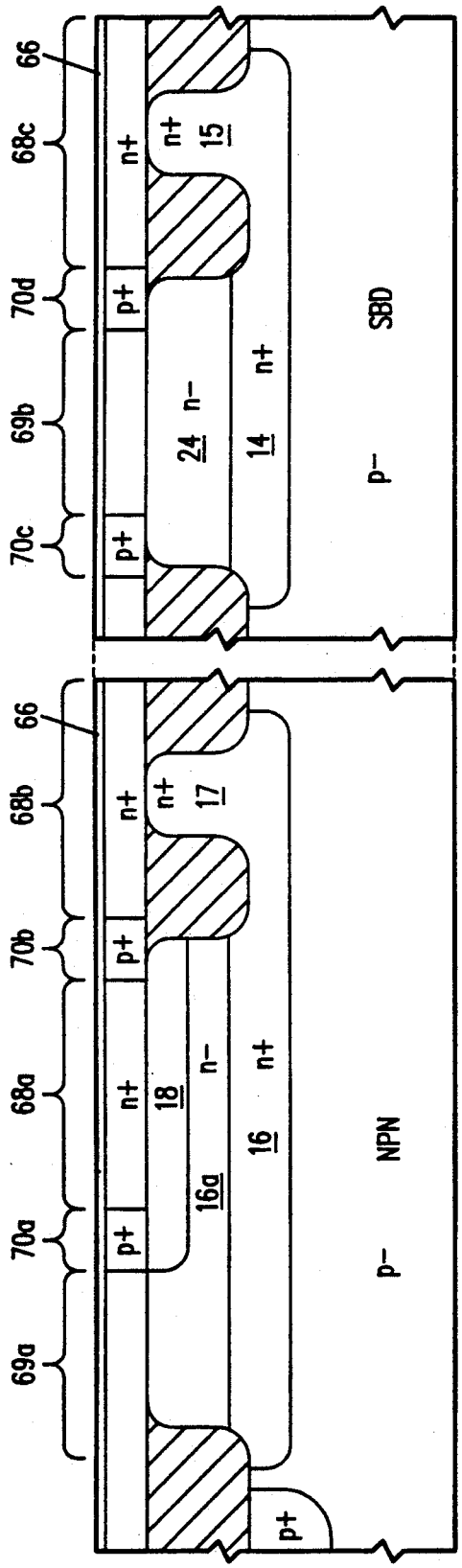

FIG. 2B illustrates the next sequence of process steps. A layer of intrinsic polysilicon 64 having a thickness of about 3500 Å is deposited across the surface of the device and a cap oxide layer 66 is formed by thermal oxidation of the polysilicon layer 64. The devices are then masked with photoresist 65 to expose at least the base region of the bipolar transistor. A base implant 67 is then performed followed by an annealing step. In preferred embodiments the base implant 67 uses an energy of between about 30 and 100 keV. Before annealing, the polysilicon has a net dopant concentration of between about $1\times 10^{17}$ and $1\times 10^{19}$, and a portion of this dopant is diffused into the base region 18 (FIG. 2C) during the anneal. In preferred embodiments the anneal is performed by heating the structure to 900°-1000° C. for 20 to 60 minutes, and results in a p- base region having a thickness of between about 1000 and 4000 with a dopant concentration of between about $1 \times 10^{17}$ and $1 \times 10^{19}$, with a dopant concentration of about $1 \times 10^{18}$ preferred.

Thereafter, a mask (not shown) is formed which exposes regions 70a, 70b, 70c, and 70d (FIG. 2C) which will eventually be the base contacts 26, 26', and the SBD ring guard diffusion source 29a, 29b. The regions 70a, 70b, 70c, 70d are preferably doped p+ to a concentration of between about $1 \times 10^{17}$ and $1 \times 10^{20}$ with a dopant concentration of about $1 \times 10^{19}$ preferred using boron. The p+ mask is removed and another mask (not shown) is formed on the surface of the device to expose regions 68a, 68b, and 68c which will eventually be used as the bipolar emitter contact 27, the bipolar collector contact 20, and the SBD cathode contact 36. The regions 68 are doped n+ using an implant energy of about 100 keV to a concentration of between about $1 \times 10^{18}$ and $1 \times 10^{20}$ with a dopant concentration of between about $1 \times 10^{19}$ and $1 \times 10^{20}$ preferably using arsenic. During these procedures, regions 69a and 69b remain masked so that the underlying polysilicon regions will remain intrinsic to form the intrinsic polysilicon regions 30, 32.

Figure 2D:
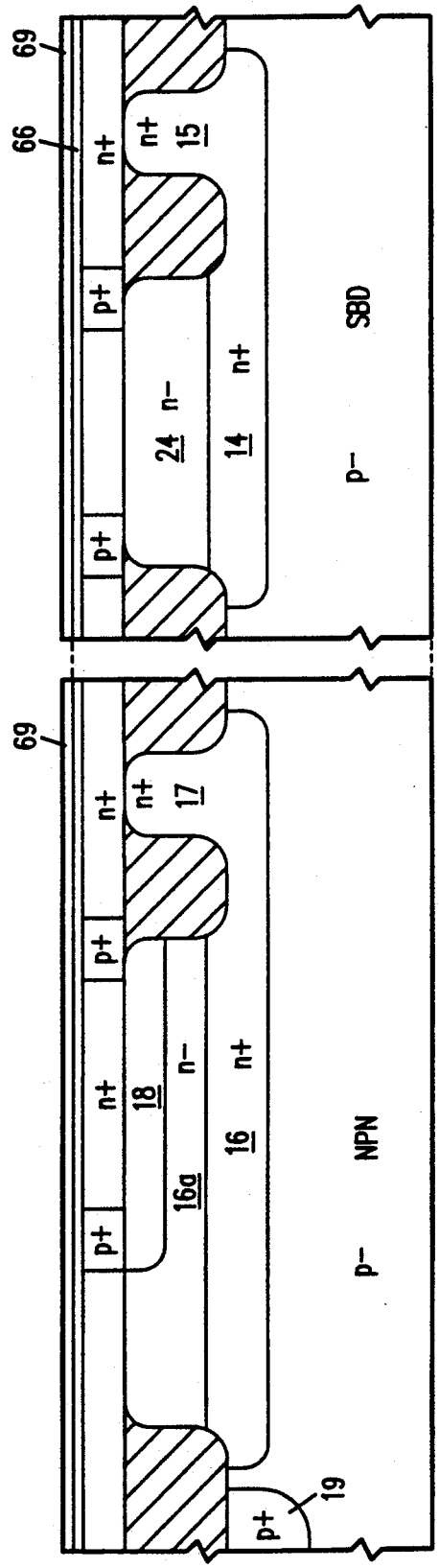

In FIG. 2D, a layer of nitride 69 having a thickness of between about 1000 and 1500 Å is deposited for the purpose of preventing the later implants from going through the emitter. An anneal is then performed at 850° to 950° C. for a time of about 10 to 20 minutes.

Next, a mask (not shown) is formed on the surface of the nitride to define the base, emitter, and collector contacts of the bipolar transistor and intrinsic poly regions, guard ring source regions, and cathode contact of the Schottky diodes. A dry etch with chlorine or bromine chemistry results in the structure shown in FIG. 2E. As illustrated in FIG. 2F, a p-type lightly-doped implant 71 using a dopant such as $BF_2$ or B+ is performed across the surface of the bipolar transistor with only the extrinsic base region of the bipolar transistor exposed by a mask. A more heavily doped p-region 74 is formed in the extrinsic base of the bipolar transistor. The resulting net dopant concentration in the region 74 is between about $1 \times 10^{17}$ and $1 \times 10^{20}$, with about $1 \times 10^{19}$ preferred. The implant energy is preferably between about 10 and 50 keV. When 11 B+ is used as the dopant, the lower range of implant energy is used.

Figure 2G:
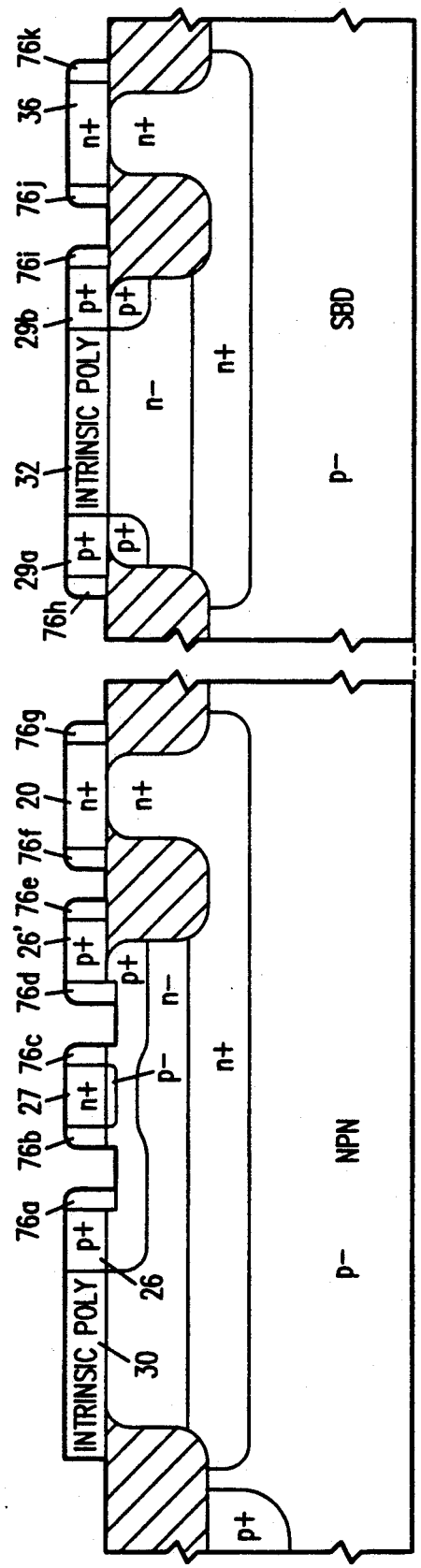
Figure 2H:
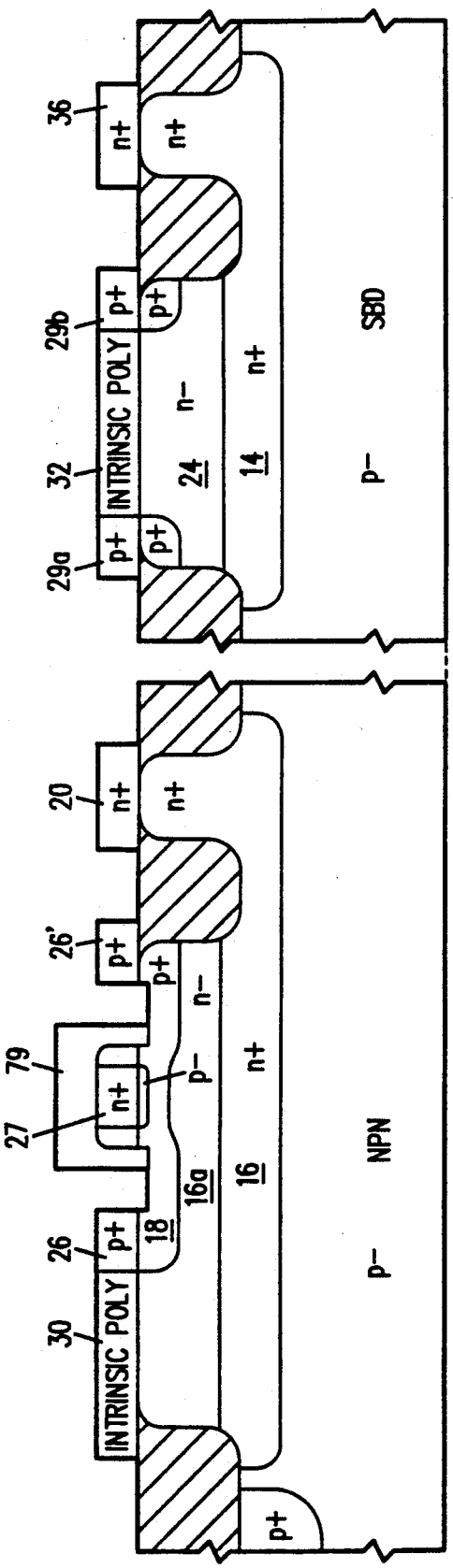

A cap oxidation is performed to protect the heavily doped silicon regions during the nitride strip. Nitride is then stripped from the surface of the device and a low temperature oxide (LTO) deposition is performed. The oxide is then etched back, leaving spacer oxide 76a–76k on exposed sides of emitter contact 27, base contacts 26, 26', collector contact 20, diffusion source regions 29a, 29b, and SBD cathode contact 36 as shown in FIG. 2G using means known to those of skill in the art. Another mask 79 (FIG. 2H) is then formed over the device for protection of at least the sidewall oxide on the bipolar emitter contact 27. The device is etched with BOE for about 80 seconds and, as shown in FIG. 2H, the oxide is removed from the sidewalls other than the emitter sidewalls.

Referring to FIG. 2I, a mask (not shown) is formed and a heavy p+ ($BF_2$) implant 81 is performed in the regions shown therein, i.e., in the region of the source/-drain of the PMOS transistor and the extrinsic base region of the bipolar transistor. The purpose of this implant is to lower the base sheet resistances and contact resistances. The implant uses an energy of between about 20 and 100 keV, with 40 keV preferred. The device is then RTA annealed at a temperature of about 1000 to 1100° C. for about 10 to 20 seconds.

Next, a layer of refractory metal such as titanium, molybdenum, tantalum, tungsten, or the like, is deposited across the surface of the device. Using means well known to those of skill in the art, the layer is heated to form metal silicide in regions where the deposited metal is in contact with polysilicon and silicon. Remaining unreacted metal is then etched away from the device, leaving a structure as shown in FIG. 2J. Preferably, the silicide reaction is conducted in two steps. The initially deposited titanium is reacted with adjacent polysilicon and silicon for a first period of time, as needed to form an initial amount of silicide that will adhere to the adjacent layers. In the first reaction, titanium does not react with $SiO_2$. Unreacted titanium, principally titanium in contact with any oxide, is removed, for example using $H_2O_2$ or $NH_3OH$. The device is again heated to cause a second silicide reaction to occur, completing the reaction between titanium and adjacent polysilicon and epitaxial silicon. The reaction is preferably conducted in two steps, as described, because reaction of titanium in a single step or pulse may cause undesirable reaction of titanium with the sidewall oxide layers.

As shown in FIG. 2J, the bipolar polysilicon base contacts 26, 26' are covered with silicide 46, 46' across their horizontal upper surfaces, and along their vertical sidewalls. In addition, the silicide contacts extend 47, 47' from the vertical sidewalls along the horizontal upper surface of the single-crystal base fully up to the sidewall oxide 44a, 44b of the emitter 27. The silicide 46 extends 48 over the intrinsic polysilicon region 30 which is adjacent to the base contact 26. The silicide layer 48 is substantially continuous with the silicide layer 46. The silicide contact 48 of the emitter 27 extends across the horizontal upper surface of the emitter from one sidewall oxide 44a to the opposite sidewall oxide 44b. The silicide 80 on the collector contact 20 extends up both vertical sidewalls of the collector contact and fully across the horizontal upper surface of the contact, terminating on the field oxide regions 22a and 22d. A layer of silicide 52 extends across the horizontal upper surface of the intrinsic polysilicon region 32 and extends over the diffusion source regions 29a, 29b. Silicide 50 [50] extends over the horizontal upper surface of the SBD cathode contact 36.

Figure 2K:
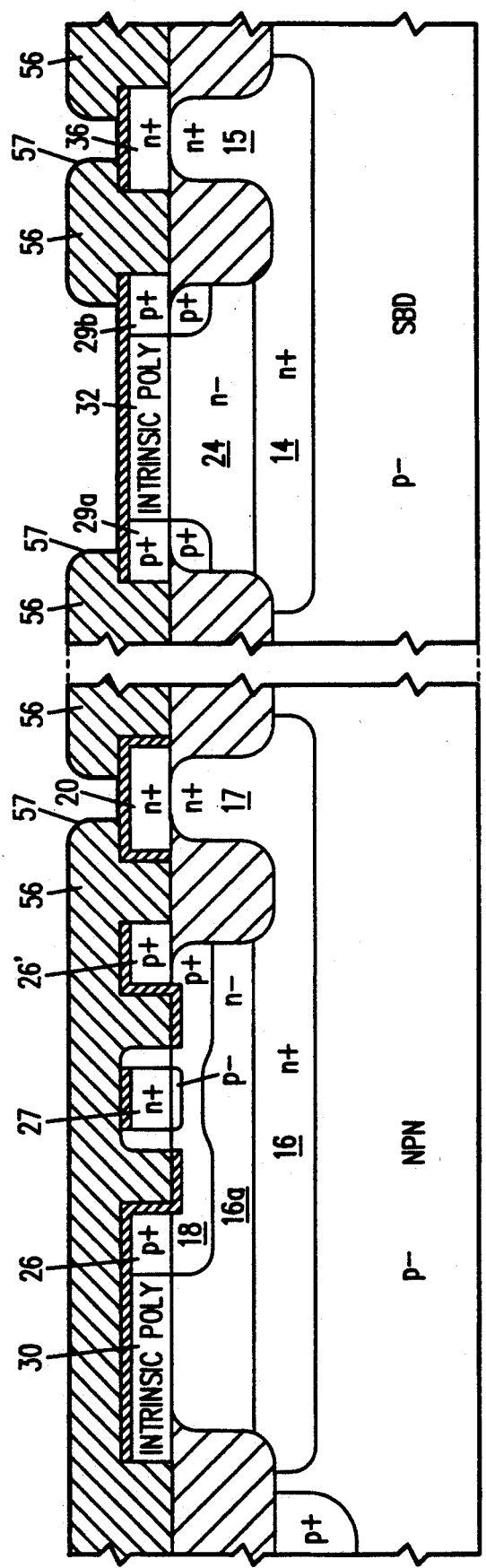

FIG. 2K illustrates the next step in the fabrication sequence in which oxide layer 56 is deposited and masked to form contact holes 57 therein. Metal is deposited on the surface of the device, masked, and etched from selected regions, providing the device shown in FIG. 1.

III. Device Performance

Figure 4:
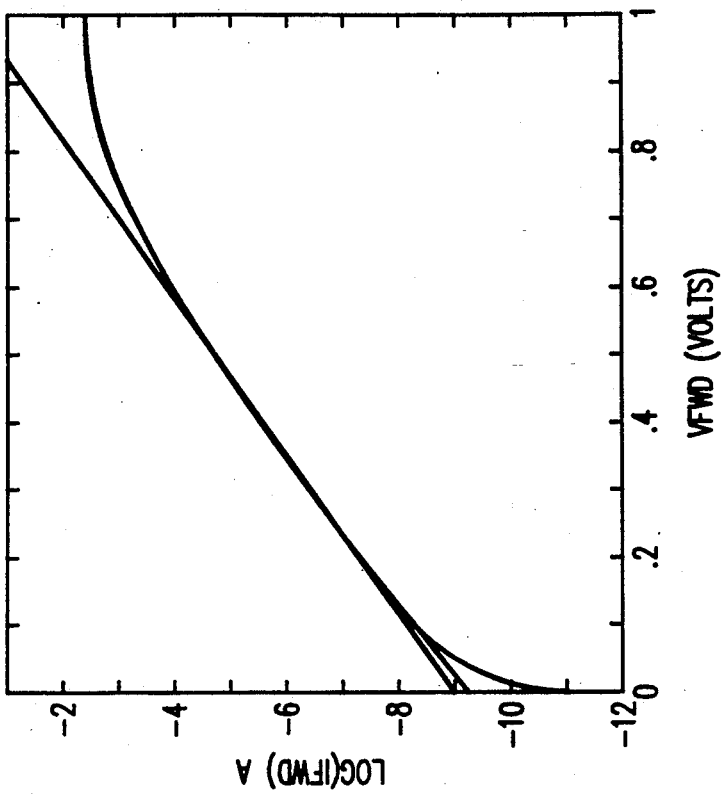
FIG. 4 is a logarithmic plot of $V_{fwd}$ versus $I_{fwd}$ for a Schottky diode formed according to the present invention.
Figure 3:
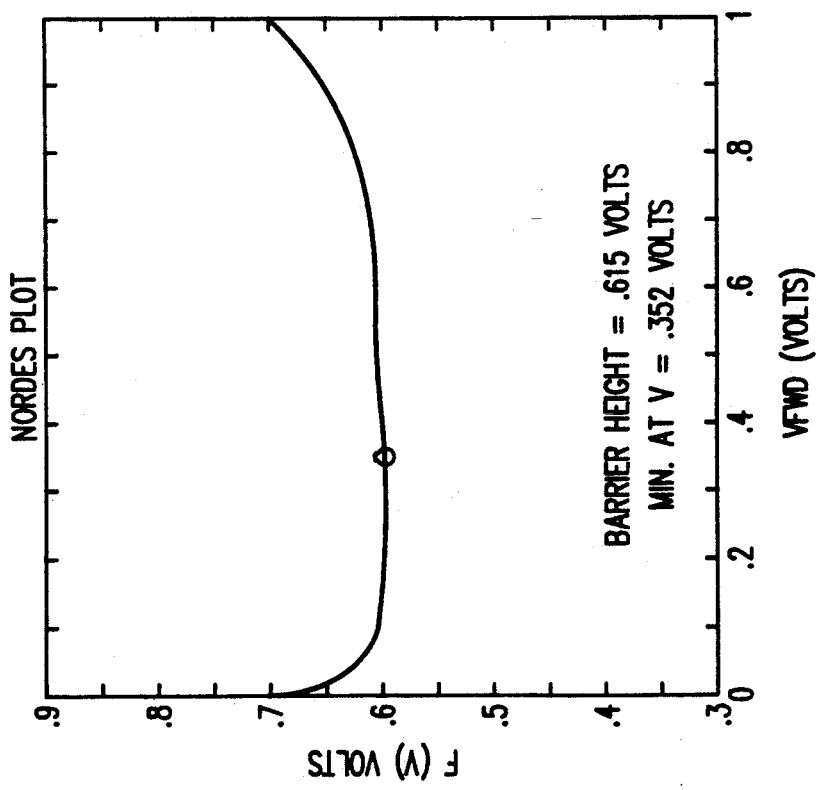
FIG. 3 is a Nordes plot of $V_{fwd}$ versus $F(V_{fwd})$ for a Schottky diode formed according to the present invention.

FIG. 3 is a Nordes plot for a Schottky diode fabricated according to one embodiment of the invention. As shown in FIG. 3, at the minimum voltage of V=0.352 volts, the barrier height is 0.615 volts. FIG. 4 is a logarithmic plot of the forward current versus the forward voltage for a Schottky diode fabricated according to one embodiment of the invention. The figure shows a desirable linearity particularly in the range of about 0.1 to about 0.7 volts of forward voltage and demonstrates the small size of the leakage current for the Schottky diode.

Table 1 shows measured parameters for Schottky diodes formed according to one embodiment of the present invention. The leakage current $I_r$ at 10 volts is relatively small. The breakdown voltage $V_r$ at a current of 10 micro amps. is about 28 volts. The forward (threshold) voltage at 10 microamps. is about 0.5 volts. As is well known in the art, various parameters such as the value of the forward voltage can be adjusted by using different materials such as by using aluminum in place of metal silicide.

TABLE I

| | $I_r$ (amperes) | $V_r$ (volts) | $V_f$ (volts) |
|---|---|---|---|
| Diode #1 | $2.74 \times 10^{-11}$ | $-2.86 \times 10^1$ | $5.06 \times 10^{-1}$ |
| Diode #2 | $-3.13 \times 10^{-11}$ | $-2.83 \times 10^1$ | $4.98 \times 10^{-1}$ |
| Diode #3 | $-6.38 \times 10^{-11}$ | $-2.85 \times 10^1$ | $4.98 \times 10^{-1}$ |

FIGS. 3 and 4 and Table I illustrate that a device formed as described operates in the fashion of a Schottky diode.

It is to be understood that the above description is intended to be illustrative and not restrictive. Many variations of the invention will become apparent to those of skill in the art upon review of this disclosure. By way of example, although the invention has been illustrated with regard to specific dopant concentrations in some instances, it should also be clear that a wide range of dopant concentrations may be used for many features of the devices herein without departing from the scope of the invention. While the inventions have been illustrated primarily in relation to bipolar devices, many facets of the invention could be applied in the fabrication of BiCMOS devices, MOSFETs, or other devices in isolation. When the Schottky diodes of the present invention are formed as part of an overall process for producing a BiCMOS device, additional process steps are used as described, for example, in co-pending and commonly assigned U.S. patent application, Ser. No. 503,498, filed 4/2/90, incorporated herein by reference. The scope of the invention should, therefore, be determined not with reference to the above description, but instead should be determined with reference to the appended claims along with their full scope of equivalence.

What is claimed is:

1. A Schottky barrier diode comprising:
   a layer of n-doped silicon having an upper surface, said n-doped silicon forming the cathode of said Schottky barrier diode;
   a layer of intrinsic polysilicon adjacent said upper surface of said layer of n-doped silicon, said layer of intrinsic polysilicon having an upper surface;
   a layer of metal silicide having a first portion adjacent said upper surface of said layer of intrinsic polysilicon said first portion of said metal silicide-forming the anode of said Schottky barrier diode;
   first cathode contact means positioned at a level above said upper surface of said layer of N-doped silicon and spaced from said anode; and
   a low resistance connection region for providing electrical connection between said layer of n-doped silicon and said first cathode contact means.

2. A Schottky barrier diode, as claimed in claim 1, wherein said connection region comprises an n-type active layer formed in an integrated circuit.

3. A Schottky barrier diode, as claimed in claim 1, further comprising a second contact means for providing electrical connection to said layer of metal silicide.

4. A Schottky barrier diode, as claimed in claim 3, wherein said second contact means comprises a layer of metal adjacent at least a part of said layer of metal silicide.

5. A Schottky barrier diode, as claimed in claim 1, wherein said Schottky barrier diode is formed as part of an integrated circuit, said integrated circuit including a bipolar transistor; and wherein said low resistance connection region provides electrical connection tot eh collector of said bipolar transistor.

6. A Schottky barrier diode, formed as part of an integrated circuit, said integrated circuit including a bipolar transistor, the Schottky barrier diode comprising:
   a layer of n-doped silicon having an upper surface, said n-doped silicon forming the cathode of said Schottky barrier diode;
   a layer of intrinsic polysilicon adjacent said upper surface of said layer of n-doped silicon, said layer of intrinsic polysilicon having an upper surface;
   a layer of metal silicide having a first portion adjacent said upper surface of said layer of intrinsic polysilicon said first portion of said metal silicide-forming the anode of said Schottky barrier diode;
   wherein said metal silicide layer is in contact with at least a portion of the base of said bipolar transistor.

7. A Schottky barrier diode-clamped transistor comprising:
   a substrate containing active regions forming collector, emitter and base regions of a bipolar transistor;
   doped polysilicon regions adjacent said substrate forming collector, emitter and base contacts;
   at least a first intrinsic polysilicon region adjacent a portion of said collector region;
   metal silicide overlying at least said intrinsic polysilicon and said base contact, wherein at least a portion of said metal silicide forms the anode of a Schottky barrier diode.

8. A Schottky barrier diode-clamped transistor, as claimed in claim 7, wherein said Schottky barrier diode is connected in parallel with the collector-base junction of said transistor.

* * * * *